(12) United States Patent
Chen

(10) Patent No.: US 6,846,744 B1
(45) Date of Patent: Jan. 25, 2005

(54) METHOD OF FABRICATING A BOTTLE SHAPED DEEP TRENCH FOR TRENCH CAPACITOR DRAM DEVICES

(75) Inventor: Yi-Nan Chen, Taipei (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/605,679

(22) Filed: Oct. 17, 2003

(51) Int. Cl.⁷ .......................................... H01L 21/311
(52) U.S. Cl. ................................. 438/700; 438/680
(58) Field of Search .......................... 438/700, 238, 438/242, 244, 245, 246, 248, 386, 387, 388, 389, 391, 680, 706, 745, 756, 757, 723, 724, 738, 770

(56) References Cited

U.S. PATENT DOCUMENTS

| | | | |
|---|---|---|---|
| 6,018,174 A | | 1/2000 | Schrems et al. |
| 6,071,823 A | * | 6/2000 | Hung et al. .................. 438/714 |
| 6,190,988 B1 | | 2/2001 | Furukawa et al. |
| 6,232,171 B1 | * | 5/2001 | Mei ............................ 438/246 |
| 6,365,485 B1 | * | 4/2002 | Shiao et al. ................. 438/392 |
| 6,403,412 B1 | * | 6/2002 | Economikos et al. ........ 438/238 |
| 6,448,131 B1 | | 9/2002 | Cabral, Jr. et al. |
| 6,555,430 B1 | | 4/2003 | Chudzik et al. |

* cited by examiner

*Primary Examiner*—David Nhu
(74) *Attorney, Agent, or Firm*—Winston Hsu

(57) ABSTRACT

A method for fabricating a bottle-shaped deep trench in a semiconductor substrate is disclosed. A pad stack layer is formed on a main surface of the semiconductor substrate. A deep trench is etched into the substrate through the pad stack layer. The deep trench has a vertical sidewall and a bottom surface. A CVD silicon nitride thin film is deposited on the interior surface of the deep trench. Subsequently, the upper portion of the CVD silicon nitride thin film is bombarded with inert gas ions by tilt-angle ion implantation. The bombarded upper portion of the CVD silicon nitride thin film is then selectively etched away to expose the substrate in the deep trench. The remaining CVD silicon nitride thin film at the lower portion of the deep trench serves as an oxidation mask. A thermal oxidation is carried out to oxidize the exposed substrate to form a silicon oxide layer at the neck of the deep trench. The oxidation mask is then stripped off to expose the lower portion of the deep trench, which is isotropically etched to form a bottle-shaped deep trench.

8 Claims, 9 Drawing Sheets

METHOD OF FABRICATING A BOTTLE SHAPED DEEP TRENCH FOR TRENCH CAPACITOR DRAM DEVICES

BACKGROUND OF INVENTION

1. Field of the Invention

The present invention relates to a semiconductor process, and more particularly, to a simplified process of manufacturing a bottle-shaped deep trench capacitor for a DRAM device.

2. Description of the Prior Art

Trench-capacitor DRAM devices are known in the art. A trench-storage capacitor typically consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor. As the size of a memory cell shrinks, the chip area available for a single memory cell becomes very small. This causes reduction in capacitor area on a single chip and therefore leads to problems such as inadequate capacitance and large electrode resistance.

Various schemes are known for increasing the capacitance per unit area, for example, U.S. Pat. No. 6,448,131 filed Aug. 14, 2001, entitled "Method for Increasing the Capacitance of A Trench Capacitor", assigned to International Business Machines Corp., discloses a method for increasing the trench capacitor surface area. The method, which utilizes a metal silicide to roughen the trench walls, increases capacitance due to the increase in the trench surface area after the silicide has been removed. The roughening of the trench walls can be controlled by varying one or more of the following parameters: the density of the metal, the metal film thickness, the silicide phase, and the choice of the metal.

U.S. Pat. No. 6,555,430 filed Nov. 28, 2000, entitled "Process Flow for Capacitance Enhancement In A DRAM Trench", assigned to International Business Machines Corp., discloses a method including the steps of forming a discontinuous polysilicon layer on exposed walls of a lower trench region, the discontinuous polysilicon layer having gaps therein which expose portions of said substrate; oxidizing the lower trench region such that the exposed portions of said substrate provided by the gaps in the discontinuous polysilicon layer are oxidized into oxide material which forms a smooth and wavy layer with the discontinuous polysilicon layer; and etching said oxide material so as to form smooth hemispherical grooves on the walls of the trench region.

U.S. Pat. No. 6,018,174 filed Jun. 26, 1998, entitled "Bottle-Shaped Trench Capacitor With Epi Buried Layer", assigned to Siemens Aktiengesellschaft (Munich, DE) and International Business Machines Corporation (Armonk, N.Y.), discloses a bottle-shaped trench capacitor having an expanded lower trench portion with an epi layer therein. The epi layer serves as the buried plate of the trench capacitor. A diffusion region surrounds the expanded lower trench portion to enhance the dopant concentration of the epi layer. The diffusion region is formed by, for example, gas phase doping, plasma doping, or plasma immersion ion implantation.

U.S. Pat. No. 6,190,988 filed May 28, 1998, by Toshiharu et al., entitled "Method for A Controlled Bottle Trench for A DRAM Storage Node", assigned to International Business Machines Corp., discloses a bottle-shaped trench capacitor with a buried plate formed in a controlled etch process. The bottle-shape is fabricated by etching deep trenches from a layered substrate, using the layers as a mask, and covering the sidewalls of the substrate with protective oxide and nitride layers. With the side walls covered, deep trench etching is then resumed, and a lower trench portion, below the protective layers of the side wall are formed. By diffusing a first dopant in the lower portion of the deep trench region, using the side wall protective layers as a mask, an etch stop is established for a wet etch process at the p/n junction established by the first dopant. The width of the lower trench portion is regulated by the time and temperature of the diffusion. Removing the doped material and applying a second dopant to the lower trench portion establishes a continuous buried plate region between trenches. A capacitor is formed by applying an insulating layer to the trench and filling with a conductor.

U.S. Pat. No. 6,365,485 filed Apr. 19, 2000, by Shiao et al., entitled "DRAM Technology of Buried Plate Formation of Bottle-Shaped Deep Trench", assigned to Promos Tech., Inc, (TW); Mosel Vitelic Inc. (Hsinchu, TW); Siemens Ag. (Munich, DE), discloses an improved method for forming a buried plate in a bottle-shaped deep trench capacitor. The method includes the steps of: (a) forming a deep trench into a semiconductive substrate; (b) filling the deep trench with a first dielectric material to a first predetermined depth; (c) forming a silicon nitride sidewall spacer in the deep trench above the dielectric layer; (d) removing the first dielectric layer, leaving the portion of the substrate below the sidewall spacer to be exposed; (e) using the sidewall spacer as a mask, causing the exposed portion of the substrate to be oxidized, then removing the oxidized substrate; (f) forming an arsenic-ion-dope conformal layer around the side walls of the deep trench, including the sidewall spacer; (g) heating the substrate to cause the arsenic ions to diffuse into the substrate in the deep trench not covered by the sidewall spacer; and (h) removing the entire arsenic-ion-doped layer.

However, the above-mentioned prior arts have a drawback in that the process steps for making a bottle-shaped trench are too complicated, resulting in high cost and low throughput. It is often desired to simplify the semiconductor fabrication process so as to reduce the manufacturing cost.

SUMMARY OF INVENTION

The primary objective of the present invention is to provide an improved and effective method for fabricating a bottle-shaped trench capacitor of DRAM devices.

According to the claimed invention, a method for fabricating a bottle-shaped trench for DRAM devices is disclosed. A substrate having thereon a pad layer is provided. The pad layer and the substrate are etched to form a deep trench having a vertical sidewall and bottom surface. A conformal silicon nitride protection layer is then deposited on the vertical sidewall and bottom surface of the deep trench. A title angle ion bombardment is carried out to ion bombard an upper portion of the silicon nitride protection layer. The ion bombarded upper portion of the silicon nitride protection layer is selectively etched away to expose an upper portion of the vertical sidewall of the deep trench, wherein remaining silicon nitride protection layer constitutes a silicon nitride hard mask protecting a lower portion of the deep trench. The exposed upper portion of the vertical sidewall of the deep trench is then oxidized to form a collar silicon oxide layer above the silicon nitride hard mask. Subsequently, the silicon nitride hard mask is selectively etched away. Finally, using the collar silicon oxide layer as an etch mask, the vertical sidewall and the bottom surface of the deep trench that are not covered by the collar silicon oxide layer is isotropic etched, thereby forming a bottle-shaped deep trench.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
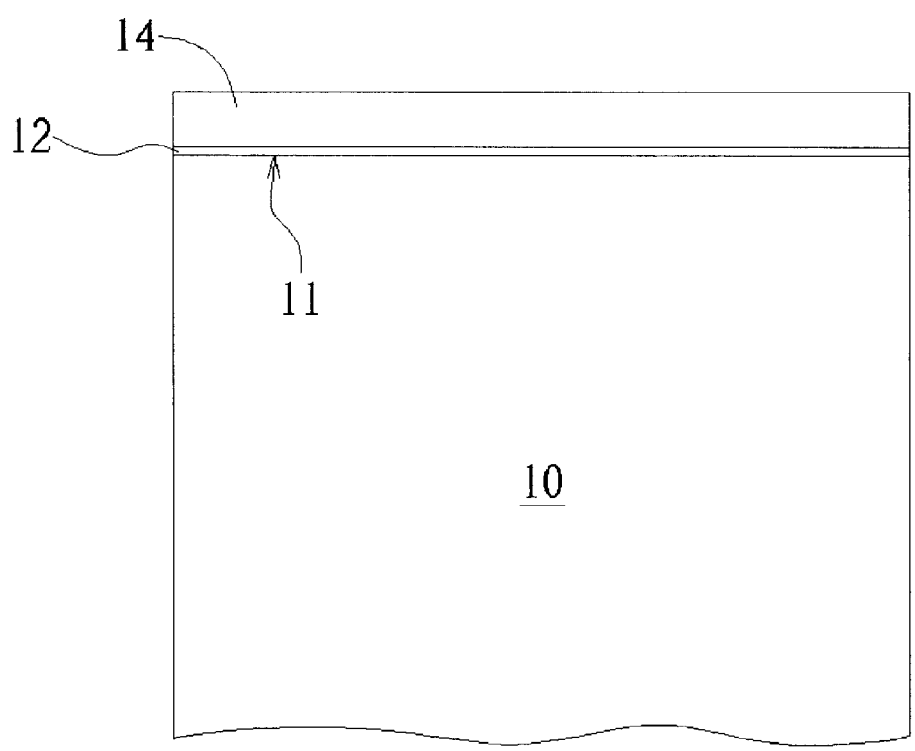
FIG. 1 to FIG. 9 are schematic cross-sectional diagrams showing the process for making a bottled shaped trench for DRAM devices according to one preferred embodiment of this invention.
Figure 2:
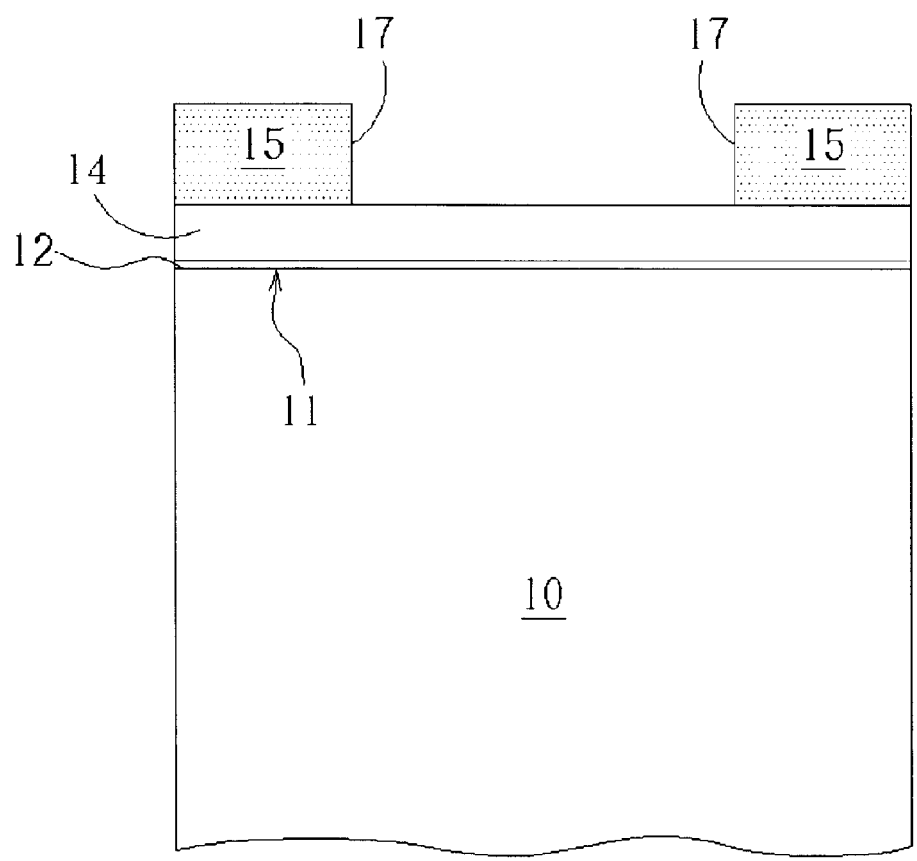

Please refer to FIG. 1 to FIG. 2. FIG. 1 to FIG. 2 are schematic cross-sectional diagrams showing the process for making a bottled shaped trench for DRAM devices according to one preferred embodiment of this invention. As shown in FIG. 1, a semiconductor substrate 10 such as a silicon substrate is provided. The semiconductor substrate 10 has a aim surface 11, ox which various semiconductor devices such as transistors are formed in later stages. A pad oxide layer 12 and a pad nitride layer 14 are sequentially formed on the main surface 11 of the semiconductor substrate 10 by any methods known in the art, for example, thermal growth or chemical vapor deposition (CVD). Preferably, the pad oxide layer 12 has a thickness of about 50 angstroms, more preferably, less than 50 angstroms.

Figure 3:
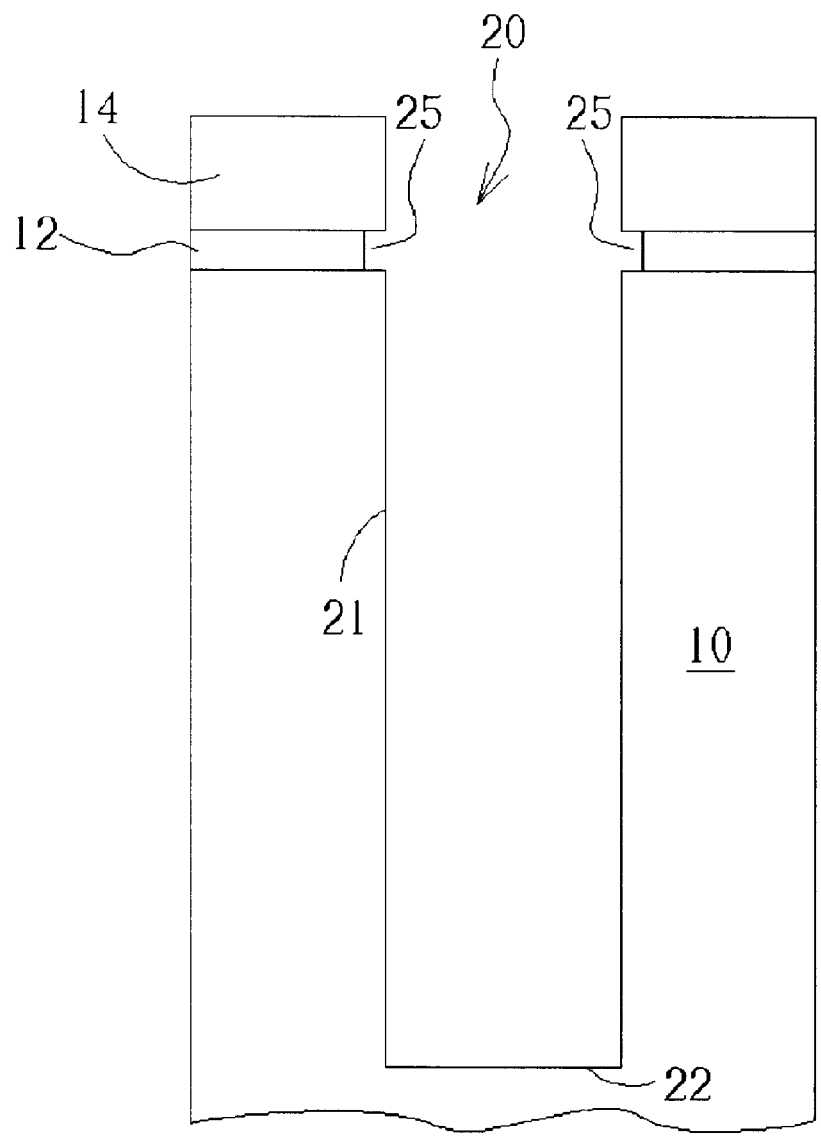

As shown in FIG. 2, a conventional lithographic process is carried out to form a photoresist layer 15 overlying the pad nitride layer 14. The photoresist layer 15 has an opening 17 that exposes the underlying pad nitride layer 14 and defines the dimensions and shape of the deep trench to be formed in the substrate 10. As shown in FIG. 3, using the photoresist layer 15 (and also the pad nitride layer 14 in some cases) as an etch mask, a deep trench dry etching process is then carried out to etch the pad nitride layer 14, the pad oxide layer 12, and the semiconductor substrate 10 through the opening 15 to a depth of about 7 micrometers or even deeper below the surface of the semiconductor substrate 10, thereby forming a deep trench 20. The deep trench 20 has a vertical sidewall 21 and a bottom surface 22. It is noted that during the dry etching of the deep trench 20, a small portion of the exposed pad oxide layer 12 around the deep trench is also etched away, which is referred to as an "oxide pull back" effect, which results in an annular recess 25 around the top of the deep trench 10.

Figure 4:
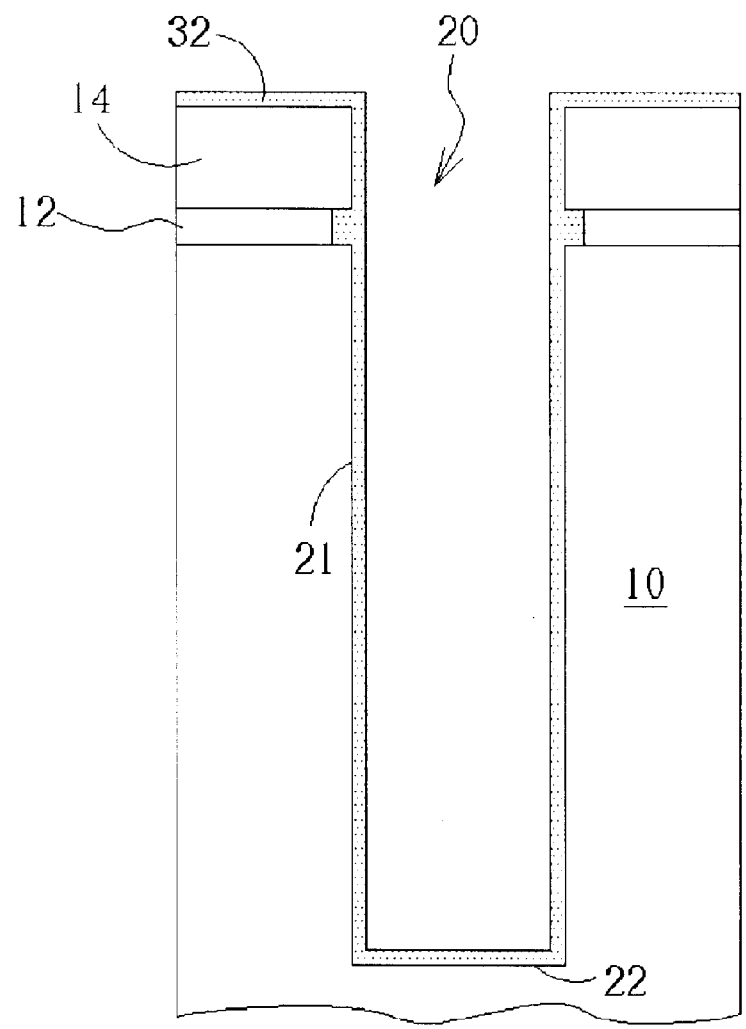

As shown in FIG. 4, a chemical vapor deposition (CVD) process is performed to deposit a conformal thin silicon nitride protection layer 32 on the vertical sidewall 21 and the bottom surface 22 of the deep trench 20, and also on the exposed surface of the pad nitride layer 14. The thin silicon nitride protection layer 32 fills the annular recess, 25 to protect the pad oxide layer 12. Preferably, the thin silicon nitride protection layer 32 has a thickness of about 200~350 angstroms.

Figure 5:
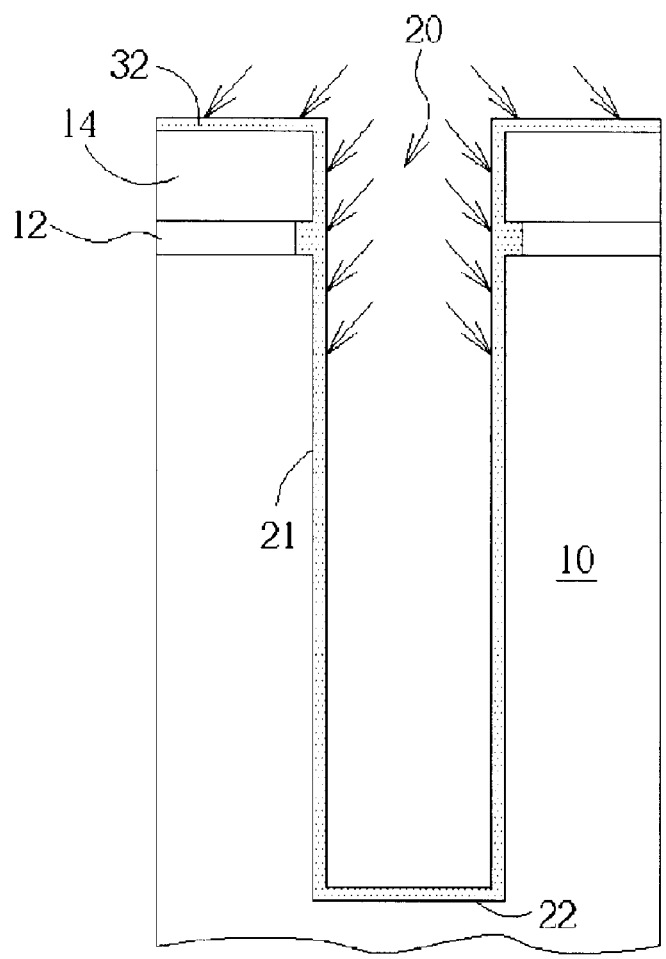

As shown in FIG. 5, a title angle ion bombardment process is then carried out at an incident title angle of about 3 to 7 degrees relative to the axis (not shown) that is perpendicular to the main surface 11 of the semiconductor substrate 10. As specifically indicated in this figure, within the title angle range of about 3° C.~7° C. relative to the axis that is perpendicular to the main surface 11 of the semiconductor substrate 10, only an upper portion of the thin silicon nitride protection layer 32 is bombarded during the title angle ion bombardment process. Preferably, inert gas ions such as argon or nitrogen ions is used during the title angle ion bombardment process, but not limited thereto. By way of example, in a case that nitrogen is used as a bombardment source, the implant dose is about $1E15 \sim 1E16$ atoms/cm$^2$, and the bombardment energy is about 20 KeV. The title angle ion bombardment process is carried out such that the bombarded upper portion of the thin silicon nitride protection layer 32 can be removed in a later etching step at high etch rate selective to the rest lower portion of the thin silicon nitride protection layer 32 that is not ion bombarded.

Figure 6:
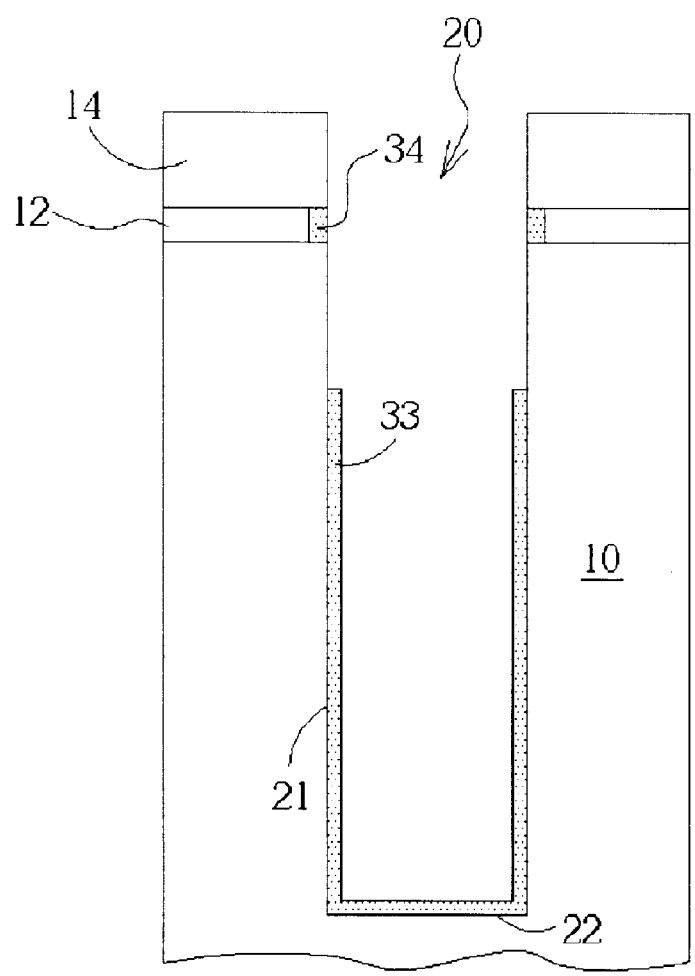

As shown in FIG. 6, a wet etching is carried out to selectively etch away the bombarded upper portion of the thin silicon nitride protection layer 32 by using wet chemistry such as phosphoric acid solution, thereby exposing an upper sidewall of the deep trench 20. In accordance with the preferred embodiment of this invention, it is found that the etching rate ratio of the bombarded upper portion of the thin silicon nitride protection layer 32 to the rest lower portion of the thin silicon nitride protection layer 32 that is not ion bombarded when using the phosphoric acid solution as an etchant is about 46:1 (etching rate of bombarded upper portion: etching rate of unbombarded portion of silicon nitride protection layer 32). The remaining thin silicon nitride protection layer 32 at the lower portion of the deep trench 20 forms a silicon nitride mask 33. The portion of the silicon nitride protection layer 32 that fills the annular recess 25 around the top of the deep trench 10 remains intact during the wet etching and forms an annular silicon nitride ring 34.

Figure 7:
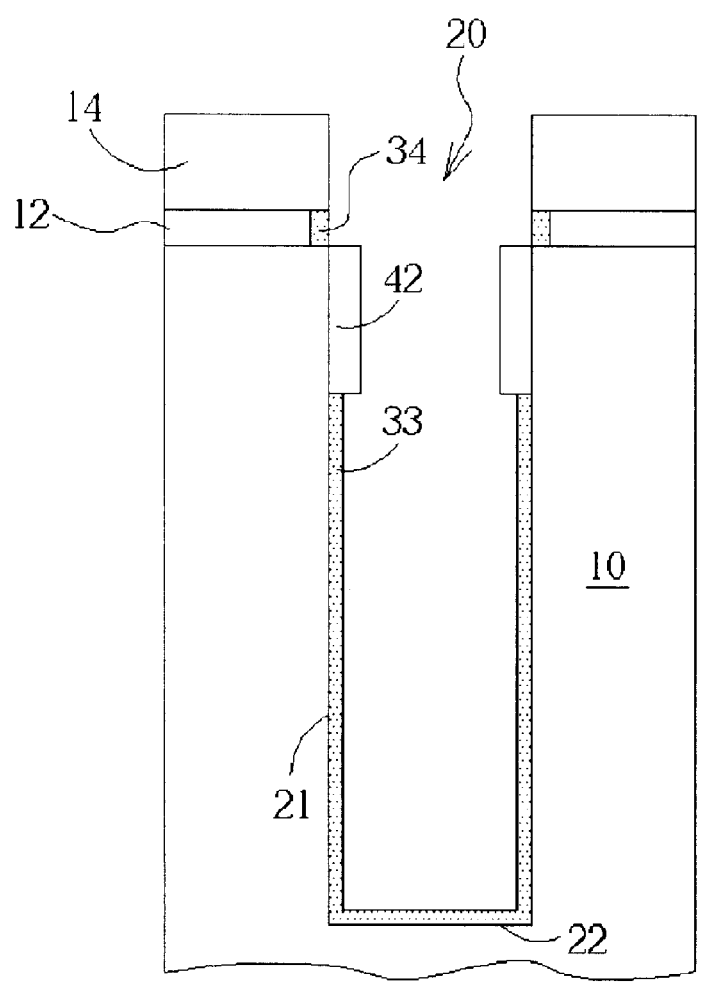

As shown in FIG. 7, subsequently, an oxidation process is performed to growth a thermal silicon dioxide layer 42 on the exposed sidewall within the deep trench 20, which is not covered by the silicon nitride mask 33. The thermal silicon dioxide layer 42 is formed between a top portion of the silicon nitride mask 33 and the annular silicon nitride ring 34. In accordance with the preferred embodiment of this invention, the thickness of the thermal silicon dioxide layer 42 is about 100~350 angstroms.

Figure 8:
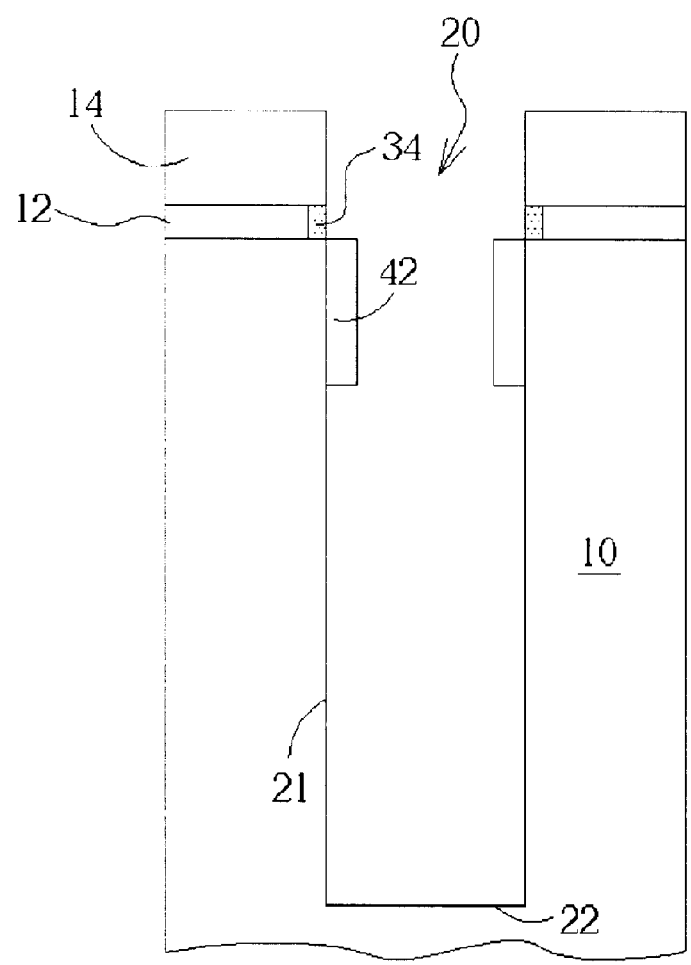
Figure 9:
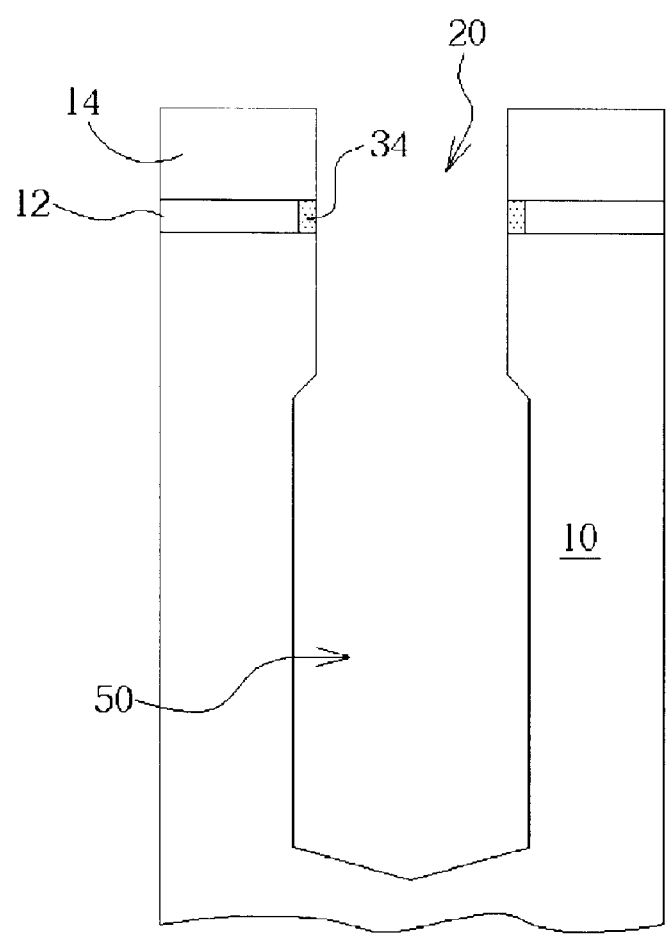

As shown in FIG. 8, thereafter, the silicon nitride mask 33 is selectively etched away by any known methods such as hot phosphoric acid, thereby exposing the lower portion of the deep trench 20. As shown in FIG. 9, using the thermal silicon dioxide layer 42 as an etch mask, an isotropic wet etching such as ammonia solution is used to etch the exposed surface of the lower portion of the deep trench 20 including sidewall 21 and bottom surface 22, thereby forming an expanded bottle shaped trench 50. Finally, the thermal silicon dioxide layer 42 is stripped by methods known in the art such as diluted hydrofluoric acid.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method for fabricating a bottle-shaped trench for DRAM devices, comprising:

providing a substrate having thereon a pad layer;

etching said pad layer and said substrate to form a deep trench having a vertical sidewall and bottom surface;

depositing a conformal silicon nitride protection layer on said vertical sidewall and bottom surface of said deep trench;

ion bombarding an upper portion of said conformal silicon nitride protection layer;

selectively etching away said ion bombarded upper portion of said conformal silicon nitride protection layer to expose an upper portion of said vertical sidewall of said deep trench, wherein remaining said conformal silicon nitride protection layer constitutes a silicon nitride hard mask protecting a lower portion of said deep trench;

oxidizing said exposed upper portion of said vertical sidewall of said deep trench thereby forming a collar silicon oxide layer above said silicon nitride hard mask;

selectively etching away said silicon nitride hard mask; and using said collar silicon oxide layer as an etch mask to isotropic etching said vertical sidewall and said bottom surface of said deep trench that are not covered by said collar silicon oxide layer, thereby forming a bottle-shaped deep trench.

2. The method according to claim 1 wherein said upper portion of said conformal silicon nitride protection layer is ion bombarded with inert gases.

3. The method according to claim 2 wherein said inert gases comprise argon and nitrogen.

4. The method according to claim 1 wherein said upper portion of said conformal silicon nitride protection layer is ion bombarded with title angle.

5. The method according to claim 1 wherein said upper portion of said conformal silicon nitride protection layer is ion bombarded with a title angle of about 3 to 7 degrees relative to an axis that is perpendicular to a main surface of said substrate.

6. The method according to claim 1 wherein said upper portion of said conformal silicon nitride protection layer is ion bombarded with bombardment energy of about 20 KeV.

7. The method according to claim 1 wherein said upper portion of said conformal silicon nitride protection layer is ion bombarded with a bombardment dose of about 1E15~1E16 atoms/cm$^2$.

8. The method according to claim 1 wherein said pad layer is etched during the etching of said deep trench, thereby forming an annular recess, and wherein said conformal silicon nitride protection layer fills said annular recess.

* * * * *